United States Patent
Johnson et al.

(10) Patent No.: US 10,154,608 B1
(45) Date of Patent: Dec. 11, 2018

(54) CABLE MANAGEMENT

(71) Applicant: EMC IP Holding Company, LLC, Hopkinton, MA (US)

(72) Inventors: Keith C. Johnson, Medway, MA (US); Thomas Thibodeau, Whitinsville, MA (US); Jeffrey M. Lewis, Maynard, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/497,579

(22) Filed: Apr. 26, 2017

(51) Int. Cl.
*H05K 7/14* (2006.01)
*F16L 3/01* (2006.01)
*A47B 88/40* (2017.01)
*F16F 1/10* (2006.01)

(52) U.S. Cl.
CPC ........... *H05K 7/1491* (2013.01); *A47B 88/40* (2017.01); *F16F 1/10* (2013.01); *F16L 3/012* (2013.01); *H05K 7/1492* (2013.01)

(58) Field of Classification Search
CPC ........................ H05K 7/1491; H05K 7/1492
See application file for complete search history.

(56) References Cited

U.S. PATENT DOCUMENTS

| | | | |
|---|---|---|---|
| 4,579,403 A | 4/1986 | Byrne | |
| 5,041,002 A | 8/1991 | Byrne | |
| 5,987,203 A | 11/1999 | Abel et al. | |
| 6,215,654 B1 | 4/2001 | Wilkie et al. | |
| 6,407,933 B1 * | 6/2002 | Bolognia | H05K 7/1491 174/168 |
| 6,646,893 B1 * | 11/2003 | Hardt | H05K 7/1491 361/730 |
| 6,944,383 B1 * | 9/2005 | Herzog | G02B 6/4455 174/50 |
| 7,140,911 B1 | 11/2006 | Rector et al. | |
| 7,279,634 B1 | 10/2007 | Chang | |
| 7,416,435 B2 | 8/2008 | Onogi | |
| 7,491,095 B1 | 2/2009 | Huang | |
| 7,873,842 B2 | 1/2011 | Chen | |
| 7,994,426 B1 | 8/2011 | Rizzuto | |
| 8,060,682 B1 | 11/2011 | Genetti et al. | |
| 8,068,351 B2 | 11/2011 | Figueroa et al. | |
| 8,144,471 B2 | 3/2012 | Morimoto | |
| 8,241,058 B1 * | 8/2012 | Fisher | H02G 11/02 439/501 |
| 8,814,445 B2 | 8/2014 | Gallegos | |

(Continued)

OTHER PUBLICATIONS

Non-Final Office Action dated Oct. 20, 2017 in counterpart application U.S. Appl. No. 15/497,561.

(Continued)

*Primary Examiner* — Hoa C Nguyen
*Assistant Examiner* — Keith Depew
(74) *Attorney, Agent, or Firm* — Brian J. Colandreo; Mark H. Whittenberger; Holland & Knight LLP

(57) ABSTRACT

A spring-pulley system is configured for use within an IT component and includes a cable assembly configured to electrically couple a fixed portion of an IT component to a slidable portion of the IT component. A pulley assembly is configured to engage the cable assembly. A spring assembly is configured to bias the pulley assembly toward a first position to absorb any slack in the cable assembly.

20 Claims, 13 Drawing Sheets

(56) References Cited

U.S. PATENT DOCUMENTS

| | | | |
|---|---|---|---|
| 8,873,250 B2* | 10/2014 | Kroupa | B65H 75/4434 242/400 |
| 8,982,582 B2 | 3/2015 | Malek et al. | |
| 9,104,387 B1* | 8/2015 | Eichelberg | G06F 1/20 |
| 9,362,635 B2 | 6/2016 | Wild et al. | |
| 9,392,722 B2 | 7/2016 | Skirmont et al. | |
| 9,520,043 B1 | 12/2016 | Alshinnawi et al. | |
| 9,531,645 B2 | 12/2016 | Loiferman et al. | |
| 9,781,859 B1* | 10/2017 | Wishman | H05K 7/1491 |
| 2002/0071266 A1* | 6/2002 | Ikeura | H02G 11/00 361/826 |
| 2004/0041389 A1 | 3/2004 | Nishide et al. | |
| 2005/0057912 A1* | 3/2005 | Hardt | H02B 1/202 361/826 |
| 2005/0237724 A1 | 10/2005 | Fiorentino | |
| 2006/0044754 A1 | 3/2006 | Hung | |
| 2006/0262492 A1 | 11/2006 | Tsai | |
| 2007/0270017 A1 | 11/2007 | Hardacker et al. | |
| 2007/0270028 A1 | 11/2007 | Huang | |
| 2008/0139022 A1 | 6/2008 | Chen et al. | |
| 2010/0110628 A1 | 5/2010 | Barrenechea et al. | |
| 2010/0172083 A1* | 7/2010 | Randall | G11B 33/126 361/679.31 |
| 2010/0254652 A1 | 10/2010 | Kirkpatrick et al. | |
| 2012/0044626 A1* | 2/2012 | Haigh | B65H 75/4449 361/679.33 |
| 2012/0044627 A1* | 2/2012 | Haigh | B65H 75/4449 361/679.33 |
| 2012/0069514 A1 | 3/2012 | Ross | |
| 2012/0162959 A1* | 6/2012 | Terada | B60N 2/0715 361/826 |
| 2013/0198532 A1 | 8/2013 | Bailey et al. | |
| 2013/0249286 A1 | 9/2013 | Hou et al. | |
| 2013/0321997 A1 | 12/2013 | Yi | |
| 2013/0342968 A1 | 12/2013 | Peterson et al. | |
| 2014/0069680 A1 | 3/2014 | Alshinnawi et al. | |
| 2014/0071602 A1 | 3/2014 | Alshinnawi et al. | |
| 2014/0281614 A1 | 9/2014 | Mick et al. | |
| 2014/0346866 A1 | 11/2014 | Feigl et al. | |
| 2015/0060009 A1 | 3/2015 | Shelnutt et al. | |
| 2015/0103488 A1 | 4/2015 | Tanaka | |
| 2015/0116913 A1 | 4/2015 | Kwon et al. | |
| 2015/0117077 A1 | 4/2015 | Huang et al. | |
| 2015/0177808 A1 | 6/2015 | Sarti | |
| 2015/0189787 A1 | 7/2015 | Bailey et al. | |
| 2015/0208544 A1 | 7/2015 | Liao et al. | |
| 2016/0044819 A1 | 2/2016 | Bailey et al. | |
| 2016/0205804 A1 | 7/2016 | Hartman | |
| 2016/0329689 A1 | 11/2016 | Yi | |
| 2016/0369844 A1* | 12/2016 | Ito | A47B 88/493 |
| 2017/0071073 A1 | 3/2017 | Chen et al. | |
| 2017/0086325 A1 | 3/2017 | Connor et al. | |
| 2017/0108899 A1 | 4/2017 | Thul | |
| 2017/0111451 A1 | 4/2017 | Thul | |
| 2017/0150635 A1 | 5/2017 | Huang et al. | |
| 2017/0164505 A1 | 6/2017 | Sarti | |
| 2017/0181314 A1 | 7/2017 | Leigh et al. | |
| 2017/0222577 A1* | 8/2017 | Anderson | H02K 7/1823 |
| 2017/0303439 A1 | 10/2017 | Cader et al. | |

OTHER PUBLICATIONS

Non-Final Office Action dated Nov. 16, 2017 in counterpart U.S. Appl. No. 15/497,442.

Final Office Action issued in U.S. Appl. No. 15/497,442, dated May 25, 2018.

\* cited by examiner

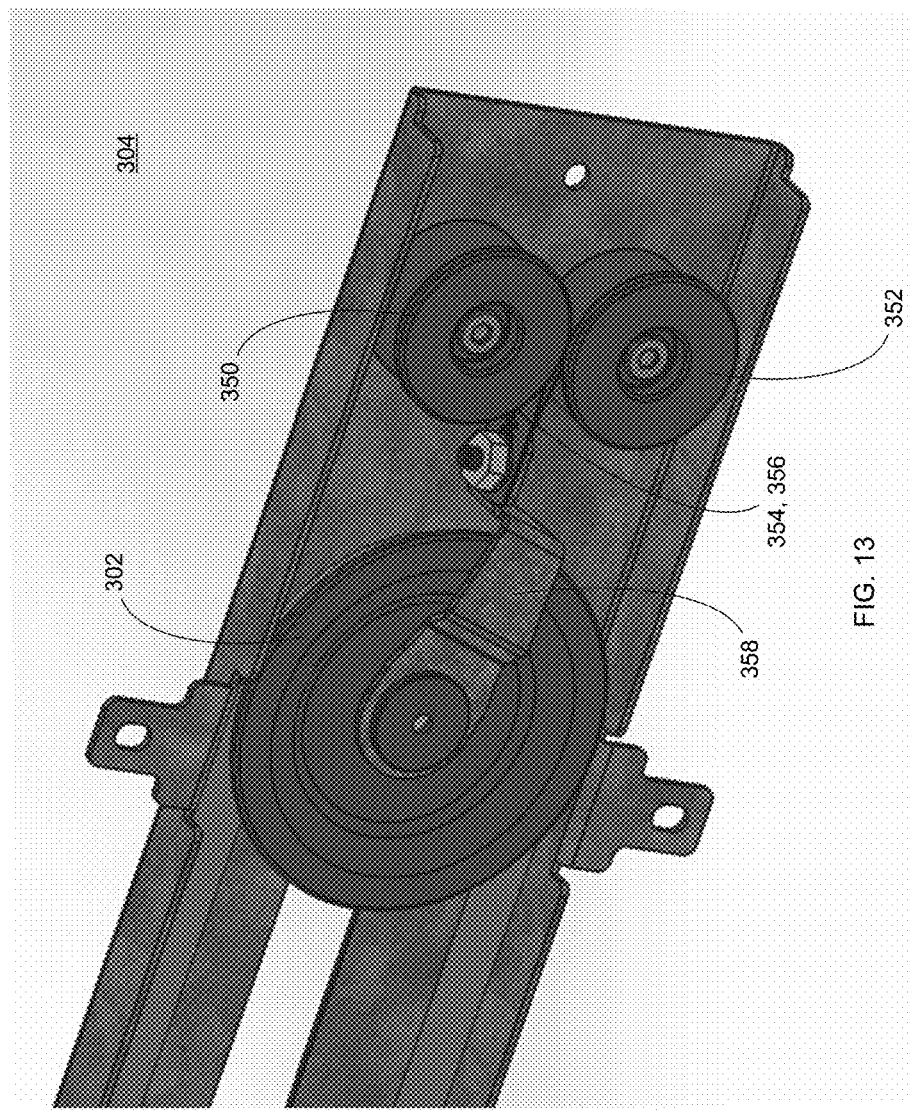

CABLE MANAGEMENT

TECHNICAL FIELD

This disclosure relates to cable management systems/components and, more particularly, to cable management systems/components for use within IT devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components that have different cabling requirements may be mounted within these IT racks, thus necessitating the use of different cabling, which may be difficult to change and may result in complications during the initial assembly of these IT components and/or the subsequent retrofit of the same.

SUMMARY OF DISCLOSURE

In one implementation, a spring-pulley system is configured for use within an IT component and includes a cable assembly configured to electrically couple a fixed portion of an IT component to a slidable portion of the IT component. A pulley assembly is configured to engage the cable assembly. A spring assembly is configured to bias the pulley assembly toward a first position to absorb any slack in the cable assembly.

One or more of the following features may be included. A first end of the cable assembly may be coupled to the fixed portion of the IT component. A second end of the cable assembly may be coupled to the slidable portion of the IT component. The spring assembly may include at least one constant force spring. The at least one constant force spring may include at least one coil configured to be coupled to the pulley assembly. The cable assembly may be a portion of an internal cable bundle. The cable assembly may be configured to provide electrical power from the fixed portion of the IT component to the slidable portion of the IT component. The spring-pulley system may be coupled to the slidable portion of the IT component. The cable assembly may be configured to electrically couple at least a portion of a cabling module to at least a portion of an external cable termination module. The cabling module may be included within the slidable portion of the IT component. The external cable termination module may be included within the fixed portion of the IT component.

In another implementation, a spring-pulley system is configured for use within an IT component and includes a cable assembly configured to electrically couple a fixed portion of an IT component to a slidable portion of the IT component. A first end of the cable assembly is coupled to the fixed portion of the IT component and a second end of the cable assembly is coupled to the slidable portion of the IT component. A pulley assembly is configured to engage the cable assembly. A spring assembly is configured to bias the pulley assembly toward a first position to absorb any slack in the cable assembly.

One or more of the following features may be included. The spring assembly may include at least one constant force spring. The at least one constant force spring may include at least one coil configured to be coupled to the pulley assembly. The spring-pulley system may be coupled to the slidable portion of the IT component. The cable assembly may be configured to electrically couple at least a portion of a cabling module to at least a portion of an external cable termination module. The cabling module may be included within the slidable portion of the IT component. The external cable termination module may be included within the fixed portion of the IT component.

In another implementation, a spring-pulley system is configured for use within an IT component and includes a cable assembly configured to electrically couple a fixed portion of an IT component to a slidable portion of the IT component. The cable assembly is a portion of an internal cable bundle and is configured to provide electrical power from the fixed portion of the IT component to the slidable portion of the IT component. A pulley assembly is configured to engage the cable assembly. A spring assembly is configured to bias the pulley assembly toward a first position to absorb any slack in the cable assembly.

One or more of the following features may be included. A first end of the cable assembly may be coupled to the fixed portion of the IT component. A second end of the cable assembly may be coupled to the slidable portion of the IT component.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a front view of the rack-mountable computing device of FIG. 2;

FIG. 13 is a detail view of a spring assembly for use with the spring-pulley system of FIGS. 10-12 according to an aspect of this disclosure.

DETAILED DESCRIPTION OF THE PREFERRED EMBODIMENTS

Like reference symbols in the various drawings indicate like elements.

Figure 1:
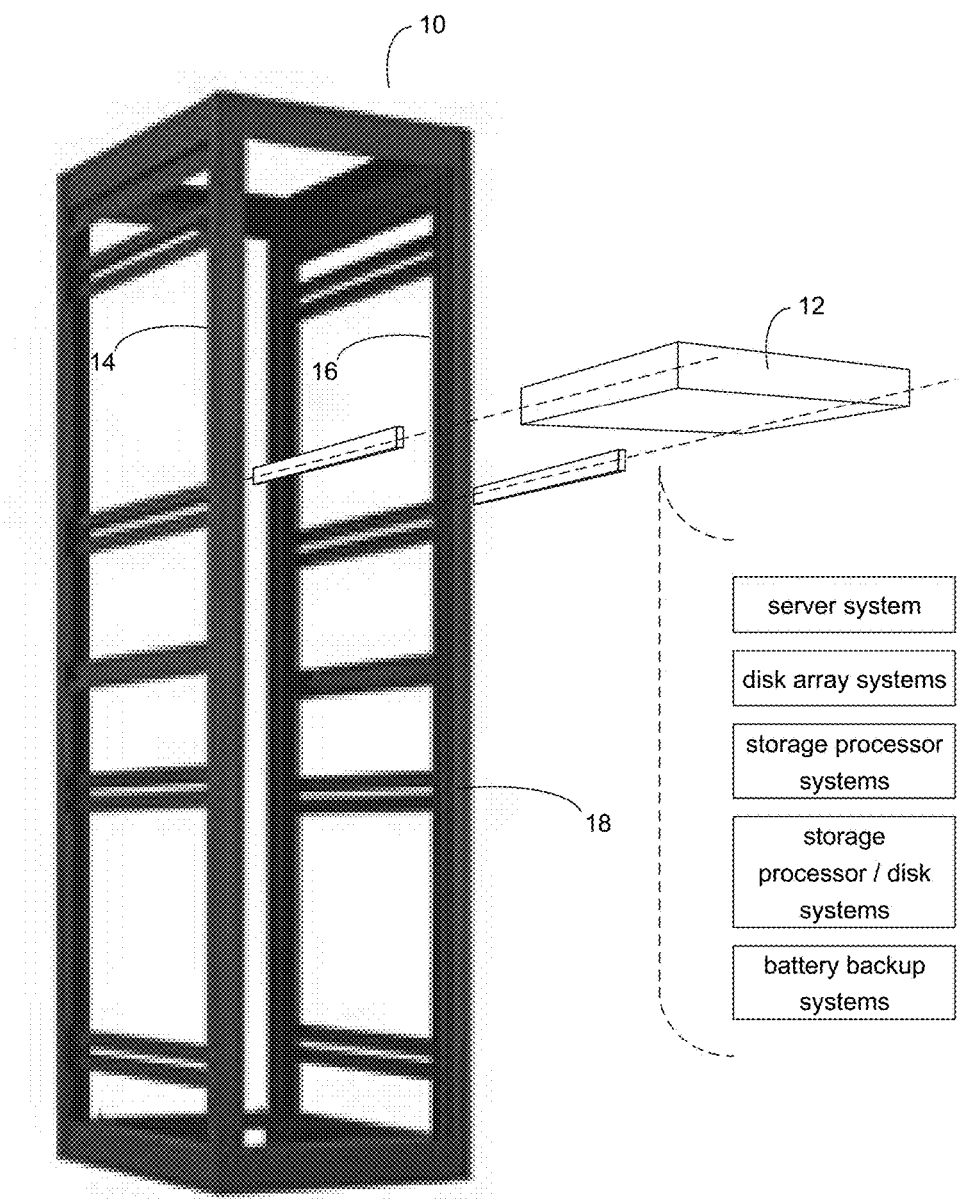
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT components that fit within a first IT rack may also fit within a second IT rack.

Typically, IT racks are defined in accordance with the number of rack units (U's) included within the rack. For example, a 1 U IT component is half as high as a 2 U IT component, which is half as high as a 4 U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2:
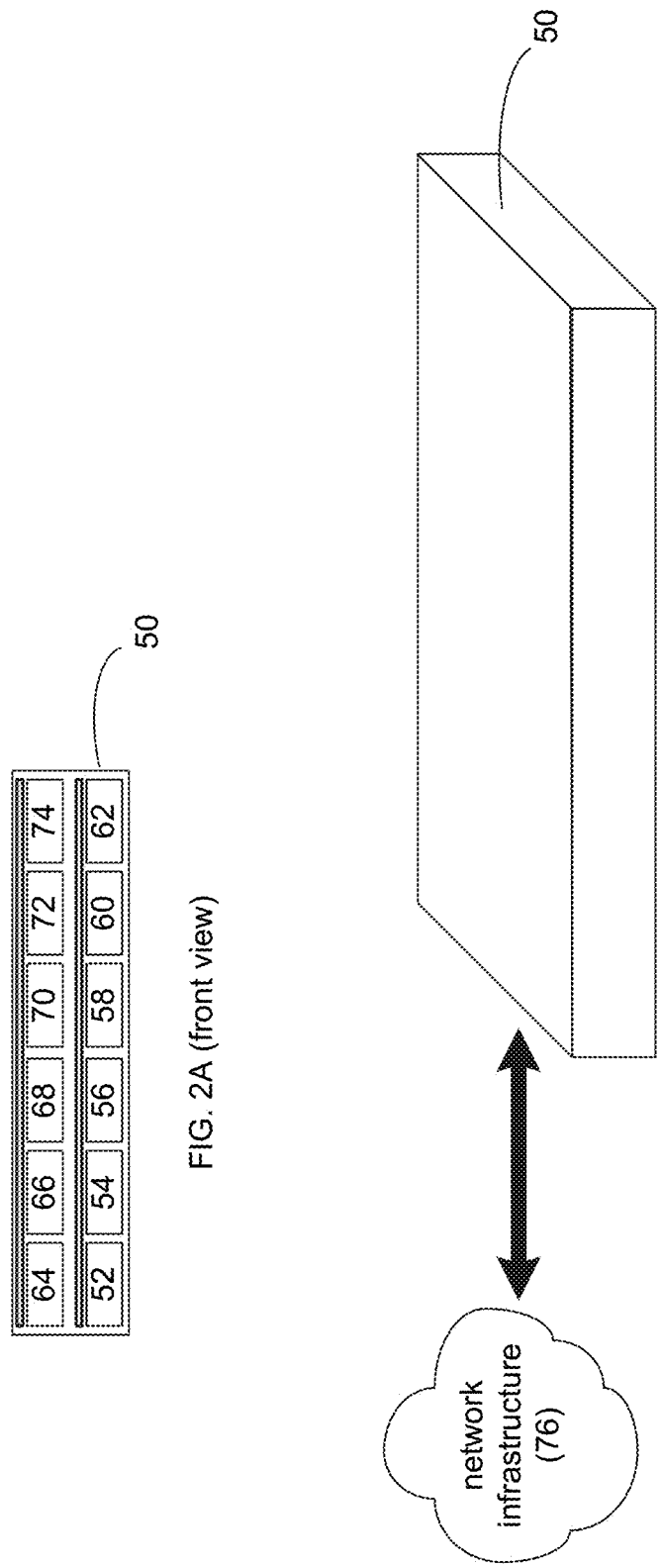
FIG. 2 is a diagrammatic view of a rack-mountable computing device for use within the IT rack of FIG. 1.

Referring to FIG. 2, there is shown one example of IT component 12, namely rack-mountable computing device 50. In this particular embodiment, rack-mountable computing device 50 may include a plurality of individual components, examples of which may include but are not limited to storage components, input/output components, and processing components, any of which may be a field replaceable unit (FRU) that is serviceable in the field.

Storage components may be the portion of rack-mountable computing device 50 that is configured to store data. Examples of such data may include but are not limited to data that is generated remotely (e.g., by applications that are executed on remote devices) or data that is generated locally (e.g., by applications that are executed on rack-mountable computing device 50). Accordingly, the storage component may be configured to include one or more storage devices, examples of which may include but are not limited to one or more rotating-media disk drives (e.g., SATA drives or SCSI drives) and/or one or more solid state storage devices (e.g., flash drives). For example and as shown in FIG. 2A, the storage component of rack-mountable computing device 50 may be configured to include (in this example) twelve 2.5 inch form factor storage devices (e.g., storage devices 52, 54, 56, 58, 60, 62, 64, 66, 68, 70, 72, 74).

The input/output components of rack-mountable computing device 50 may be the portion of rack-mountable computing device 50 that is configured to couple rack-mountable computing device 50 to a network infrastructure (e.g., network infrastructure 76), wherein network infrastructure 76 may be configured to couple rack-mountable computing device 50 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 76 may include but are not limited to an Ethernet infrastructure; a fiber channel infrastructure; and an infiniband infrastructure.

The processing components of rack-mountable computing device 50 may be the portion of rack-mountable computing device 50 that is configured to process data, such as data that is generated remotely (e.g., by applications that are executed on remote devices) or data that is generated locally (e.g., by applications that are executed on rack-mountable computing device 50). Accordingly, the processing components of rack-mountable computing device 50 may be configured to include one or more microprocessors.

Figure 3:
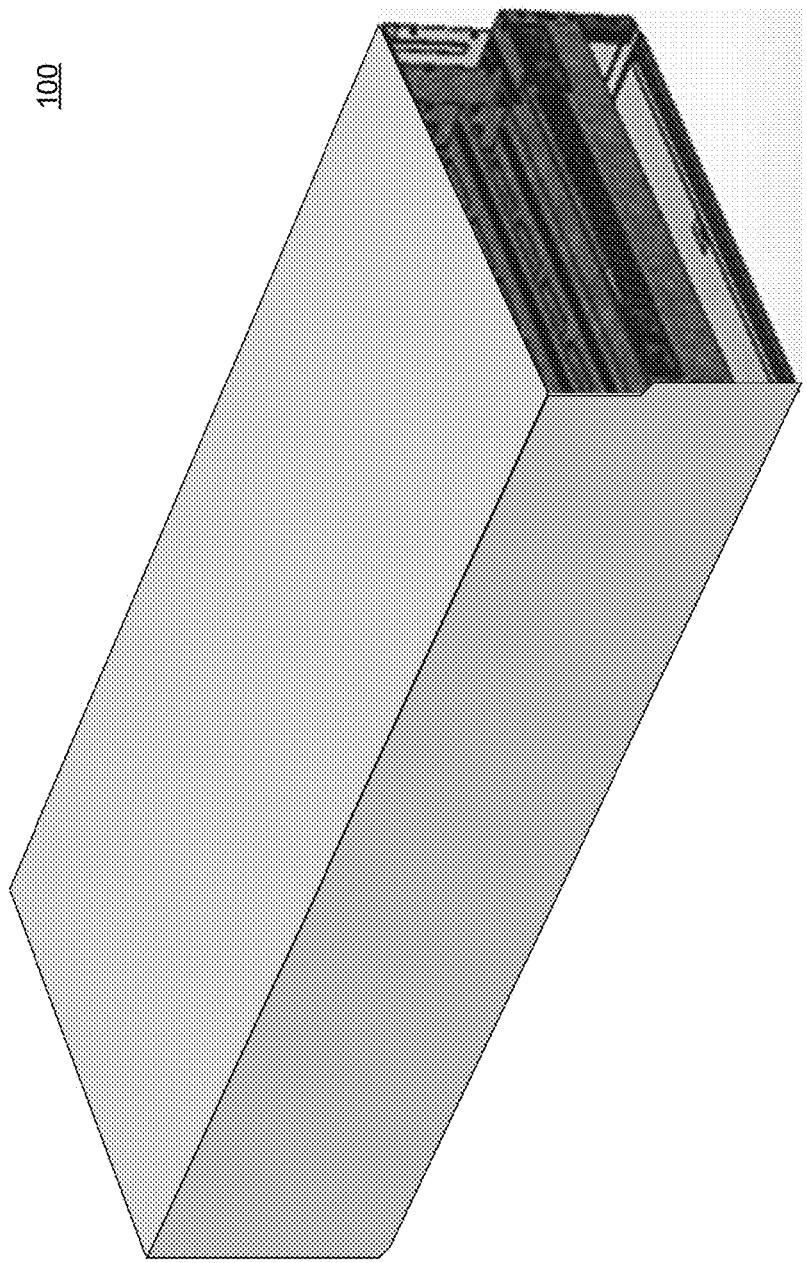
FIGS. 3-5 are diagrammatic views of a rack-mountable, hyper-converged computing device according to an aspect of this disclosure.

Referring also to FIG. 3, there is shown another example of IT component 12, namely rack-mountable, hyper-converged computing device 100. As is known in the art, hyper-convergence is a type of infrastructure system with a software-centric architecture that tightly integrates compute, storage, networking and virtualization resources and other technologies from scratch in a commodity hardware box supported by a single vendor. A hyper-converged system allows the integrated technologies to be managed as a single system through a common toolset. Hyper-converged systems may be expanded through the addition of nodes to the base unit.

Figure 4:
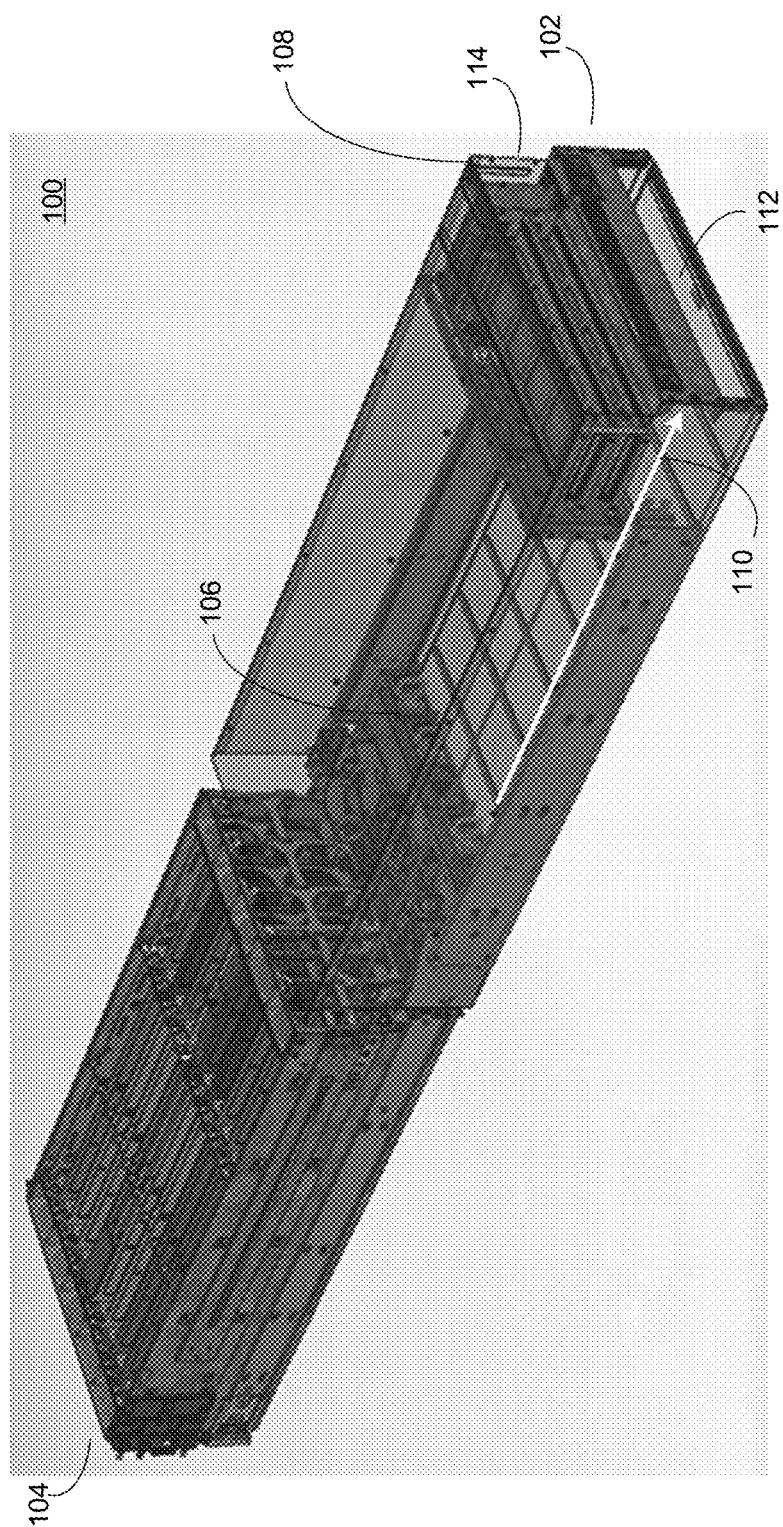

Referring also to FIG. 4, rack-mountable, hyper-converged computing device 100 may be quite large and quite densely packed. Additionally, the enclosure of rack-mountable, hyper-converged computing device 100 may be configured in a drawer fashion, wherein rack-mountable, hyper-converged computing device 100 includes a fixed portion (e.g., fixed portion 102) that may be rigidly affixed to IT rack 10 and a slidable portion (e.g., slidable portion 104) that may be configured to slide forwards (like a drawer) out of the front of IT rack 10 and away from fixed portion 102.

Additionally, slidable portion 104 of rack-mountable, hyper-converged computing device 100 may be configured so that the sub-components (e.g., storage devices, compute modules, memory modules) included within rack-mountable, hyper-converged computing device 100 may all be accessible and serviceable through the exposed top of slidable portion 104 once slidable portion 104 is slid forward and is clear of fixed portion 102 (as there will typically be another IT device mounted directly on top of rack-mountable, hyper-converged computing device 100).

Power supply units 106 within rack-mountable, hyper-converged computing device 100 may be coupled to slidable portion 104 of rack-mountable, hyper-converged computing device 100 and may, therefore, move with slidable portion 104 of rack-mountable, hyper-converged computing device 100. Accordingly, when rack-mountable, hyper-converged computing device 100 is in the extended/open position (as shown in FIG. 4), power supply units 106 may move forward and away from rear face 108 of rack-mountable, hyper-converged computing device 100. Conversely and when slidable portion 104 of rack-mountable, hyper-converged computing device 100 is pushed rearward into the closed position, power supply units 106 may move rearward (in the direction of arrow 110) and subsequently be positioned within opening 112 in rear face 108 of rack-mountable, hyper-converged computing device 100.

An upper portion (e.g., upper portion 114) of rear face 108 of rack-mountable, hyper-converged computing device 100 may be the area to which electrical power and data cables are attached. For example, data cables and power cables may be attached to various connectors on upper portion 114 of rear face 108 and interior cables carrying these signals may be routed within rack-mountable, hyper-converged computing device 100 in a manner that allows for this cabling to be coupled to and move with slidable portion 104 of rack-mountable, hyper-converged computing device 100.

Figure 5:
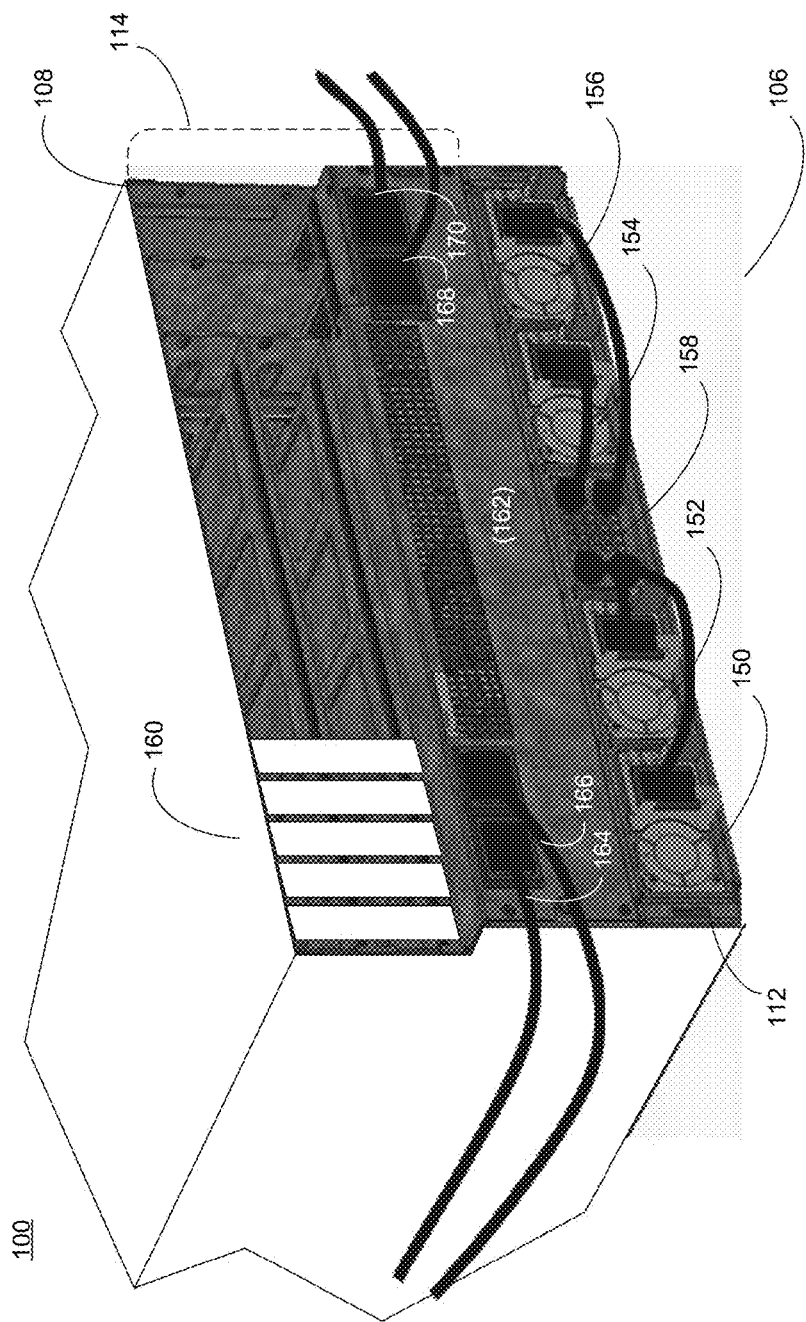

Referring also to FIG. 5, there is shown a detail view of rear face 108 of rack-mountable, hyper-converged computing device 100 in the closed position. Accordingly, power supply units 106 are shown positioned within opening 112 of rear face 108. Additionally and in this particular example, power supply units 106 are shown to include four discrete power supply units 150, 152, 154, 156 that are provided electrical power by cabling module 158 (to be explained below in greater detail).

As stated above, upper portion 114 of rear face 108 (which is affixed to fixed portion 102 of rack-mountable, hyper-converged computing device 100) may be configured so that electrical power and data cables may be attached to various connectors included therein/thereon. Accordingly and in this particular configuration, upper portion 114 of rear face 108 is shown to include plurality of host bus adapters 160 (for coupling data cables to rack-mountable, hyper-converged computing device 100). Internal data cables coupled to plurality of host bus adapters 160 may be routed within rack-mountable, hyper-converged computing device 100 and received by slidable portion 104 of rack-mountable, hyper-converged computing device 100 (which, as discussed above, may contain e.g., storage devices, computer modules, memory modules).

Upper portion 114 of rear face 108 is also shown to include external cable termination module 162 that (in this example) is configured to receive a plurality of discrete power sources. For example, as rack-mountable, hyper-converged computing device 100 is shown to include four discrete power supply units 150, 152, 154, 156, external cable termination module 162 may be configured to receive four discrete power sources (e.g., discrete power sources 164, 166, 168, 170), wherein discrete power sources 164, 166, 168, 170 may be releasably coupled to external cable termination module 162 and may be provided by one or more power distribution units (not shown). As is known in the art, a power distribution unit (or a main distribution unit) is a device fitted with multiple outputs that is designed to distribute electric power to e.g., racks of computers and networking equipment within a data center.

Accordingly, discrete power sources 164, 166, 168, 170 that are received by external cable termination module 162 may be routed within rack-mountable, hyper-converged computing device 100 and received by cabling module 158, wherein cabling module 158 may be configured to provide discrete power sources 164, 166, 168, 170 to discrete power supply units 150, 152, 154, 156 (respectively).

Figure 6:
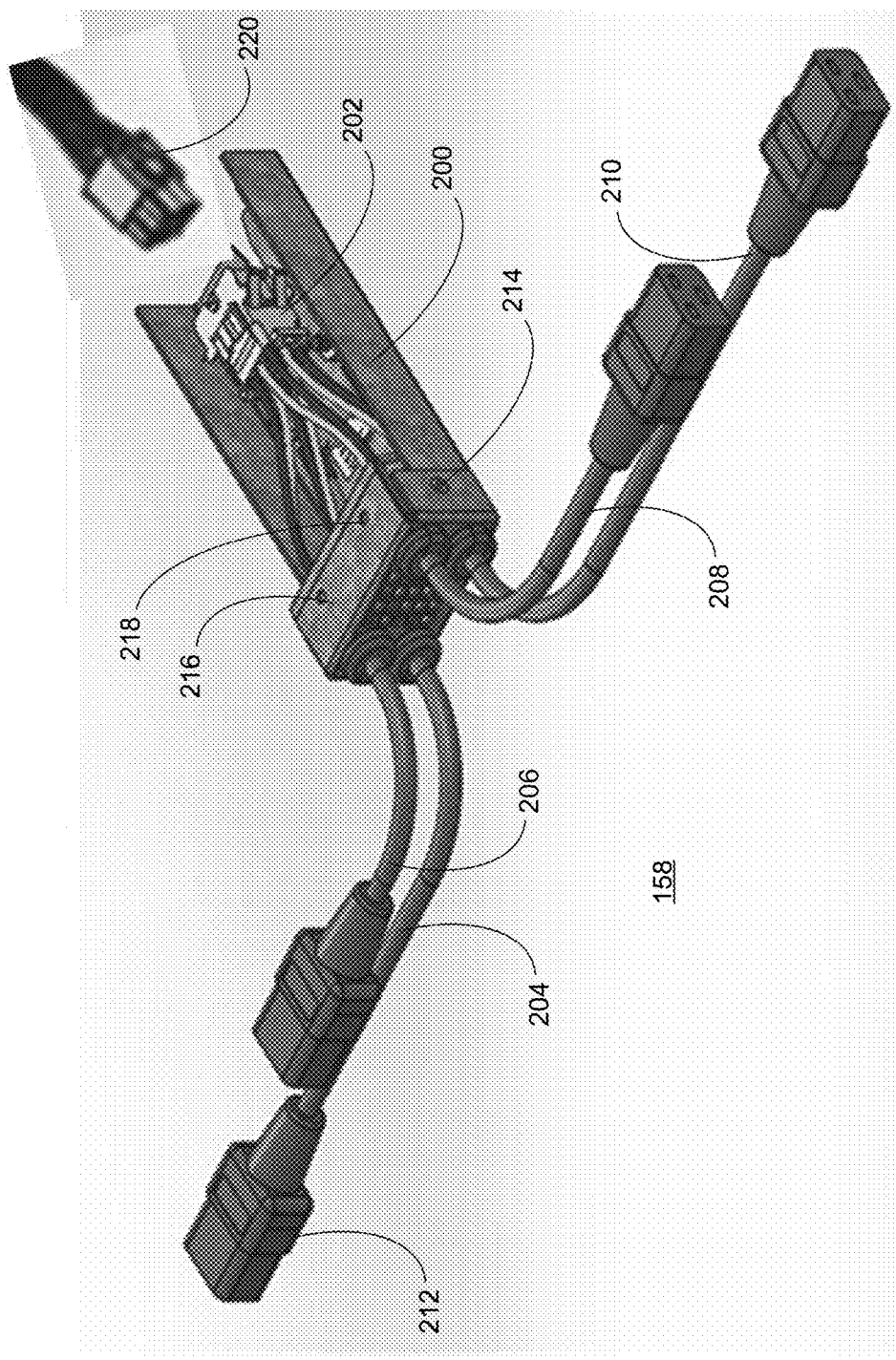
FIG. 6 is a diagrammatic view of a cabling module for use with the rack-mountable, hyper-converged computing device of FIGS. 3-5 according to an aspect of this disclosure.

Referring also to FIG. 6, cabling module 158 may be configured for use within an IT component (e.g., rack-mountable, hyper-converged computing device 100). Cabling module 158 may include enclosure assembly 200 configured to be received within rack-mountable, hyper-converged computing device 100. For example, rack-mountable, hyper-converged computing device 100 may include a socket (not shown) into which enclosure 200 of cabling module 158 may be received.

Cabling module 158 may include an input connector 202 configured to receive electrical power (e.g., discrete power sources 164, 166, 168, 170) from within rack-mountable, hyper-converged computing device 100. Cabling module 158 may include plurality of output connectors (e.g., output connectors 204, 206, 208, 210) configured to provide electrical power (e.g., discrete power sources 164, 166, 168, 170) to a plurality of subcomponents (e.g., discrete power supply units 150, 152, 154, 156) of rack-mountable, hyper-converged computing device 100. While in this particular example, output connectors 204, 206, 208, 210 are shown to provide discrete power sources 164, 166, 168, 170 (respectively) to discrete power supply units 150, 152, 154, 156 (respectively), this is for illustrative purposes only and in not intended to be a limitation of this disclosure, as other configurations are possible and are considered to be within the scope of this disclosure. Plurality of output connectors 204, 206, 208, 210 may include a plurality of electrical cords, wherein each of the plurality of electrical cords may include a plug (e.g., plug 212) configured to releasably engage one of plurality of power supply units (e.g., power supply unit 150).

Enclosure assembly 200 may be configured to be permanently affixed within rack-mountable, hyper-converged computing device 100 or releasably affixed within rack-mountable, hyper-converged computing device 100. For example and if permanently affixed, enclosure assembly 200 may be crimped to/spot-welded to rack-mountable, hyper-converged computing device 100. Alternatively and if releasably affixed, enclosure assembly 200 may be releasably affixed to rack-mountable, hyper-converged computing device 100 via one or more fasteners (e.g., that are received by threaded holes 214, 216, 218). In such a configuration, cabling module 158 may be configured to be a field replaceable unit.

Input connector 202 may be configured to releasably engage chassis connector 220 within rack-mountable, hyper-converged computing device 100. For example, chassis connector 220 may be rigidly affixed within rack-mountable, hyper-converged computing device 100 so that when cabling module 158 is slid into rack-mountable, hyper-converged computing device 100, chassis connector 220 may releasably engage input connector 202.

Through the use of cabling module 158, rack-mountable, hyper-converged computing device 100 may be quickly and easily reconfigured based upon power needs/requirements. For example and depending upon the needs of rack-mountable, hyper-converged computing device 100, discrete power supply units 150, 152, 154, 156 may have either IEC C13 connectors (which are rated for 120/240 VAC @ 15 amps) or IEC C19 connectors (which are rated for 120/240 VAC @ 20 amps). As each of these connectors has a different pin configuration, in the event that you need to upgrade your power supply units from IEC C13 to IEC C19, cabling module 158 (with IEC C13 connectors) may be simply removed and replaced with another cabling module 158 (with IEC C19 connectors).

Figure 7:
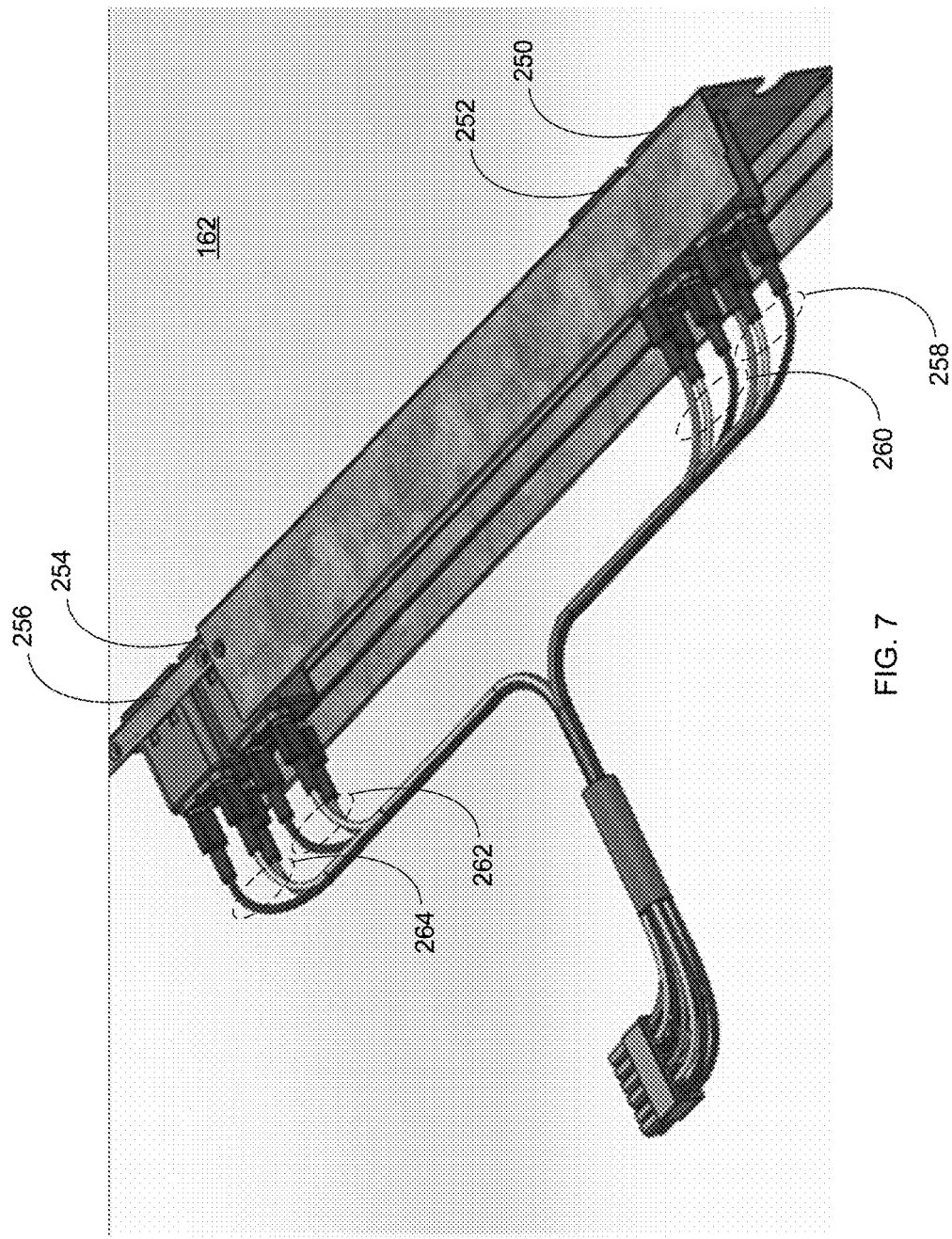
FIG. 7 is a diagrammatic view of an external cable termination module for use with the rack-mountable, hyper-converged computing device of FIGS. 3-5 according to an aspect of this disclosure.

Referring also to FIG. 7, external cable termination module 162 may include one or more input connectors (e.g., input connectors 250, 252, 254, 256 configured to receive electrical power. As discussed above, external cable termination module 162 may be configured to be coupled to discrete power sources 164, 166, 168, 170, wherein discrete power sources 164, 166, 168, 170 may be coupled to input connectors 250, 252, 254, 256. External cable termination module 162 may further include one or more output connectors (e.g., output connectors 258, 260, 262, 264) configured to provide the electrical power to rack-mountable, hyper-converged computing device 100.

As discussed above, data cables and power cables may be attached to various connectors on upper portion 114 of rear face 112 of rack-mountable, hyper-converged computing device 100 and the interior cables carrying these signals may be routed within rack-mountable, hyper-converged computing device 100 in a manner that allows for this cabling to be coupled to and move with slidable portion 104 of rack-mountable, hyper-converged computing device 100.

Figure 8:
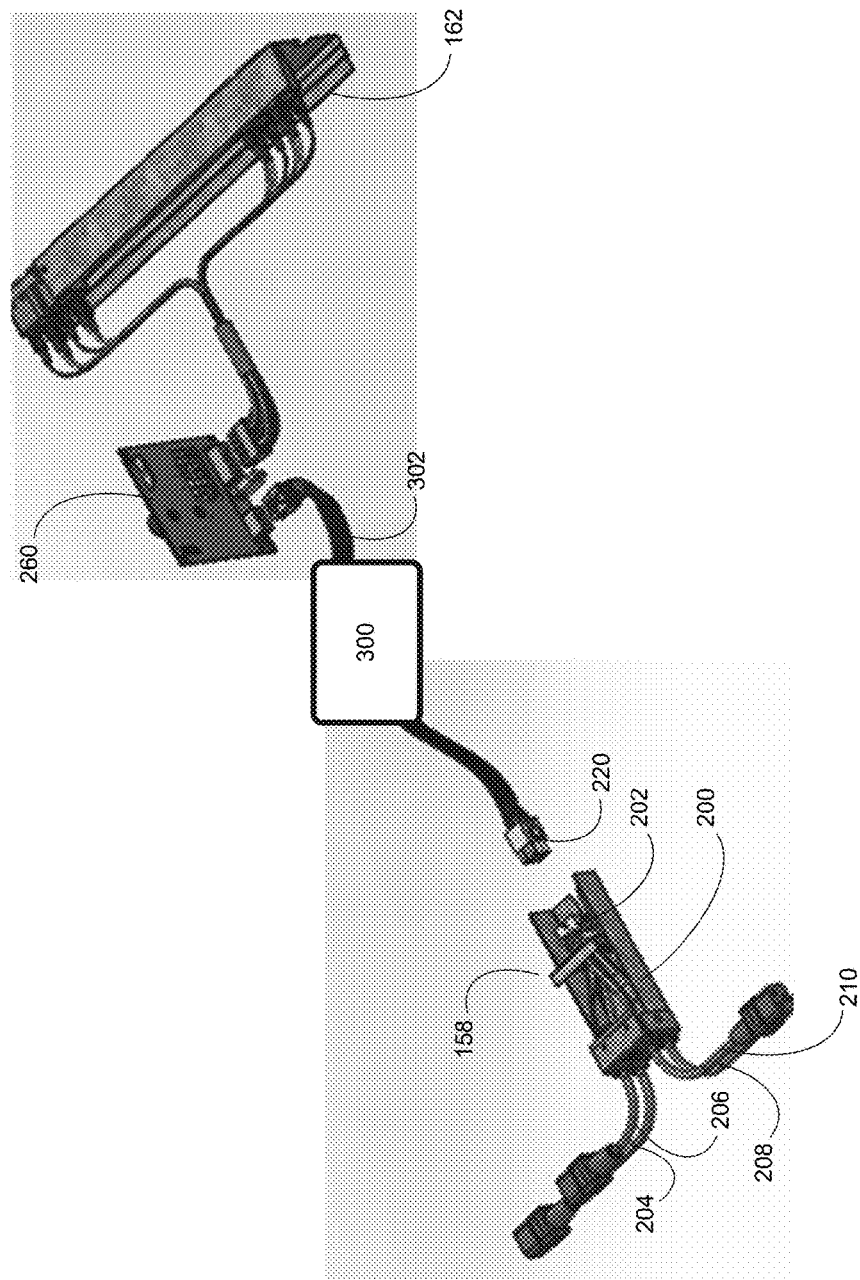
FIG. 8 is a diagrammatic view of a cable management system for use with the rack-mountable, hyper-converged computing device of FIGS. 3-5 according to an aspect of this disclosure.

Accordingly and referring also to FIG. 8, rack-mountable, hyper-converged computing device 100 may include spring-pulley system 300 that may be configured to take up any slack in internal cable bundle 302 within rack-mountable, hyper-converged computing device 100 when in the closed position. Accordingly, the combination of cabling module 158, external cable termination module 162, spring-pulley system 300 and internal cable bundle 302 may form a cable management system that is configured to route electrical power through rack-mountable, hyper-converged computing device 100 and absorb any slack in internal cable bundle 302.

Figure 9A:
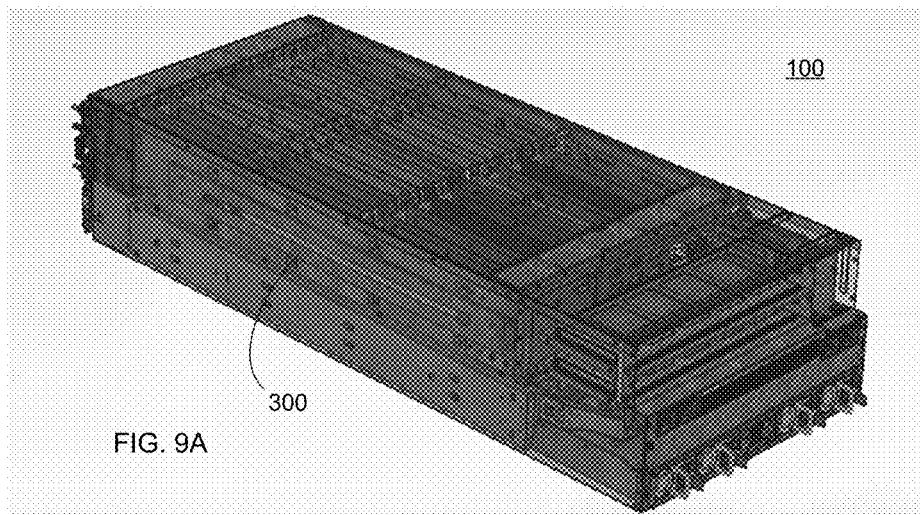
FIGS. 9A-9B are diagrammatic views of a rack-mountable, hyper-converged computing device according to an aspect of this disclosure.
Figure 9B:
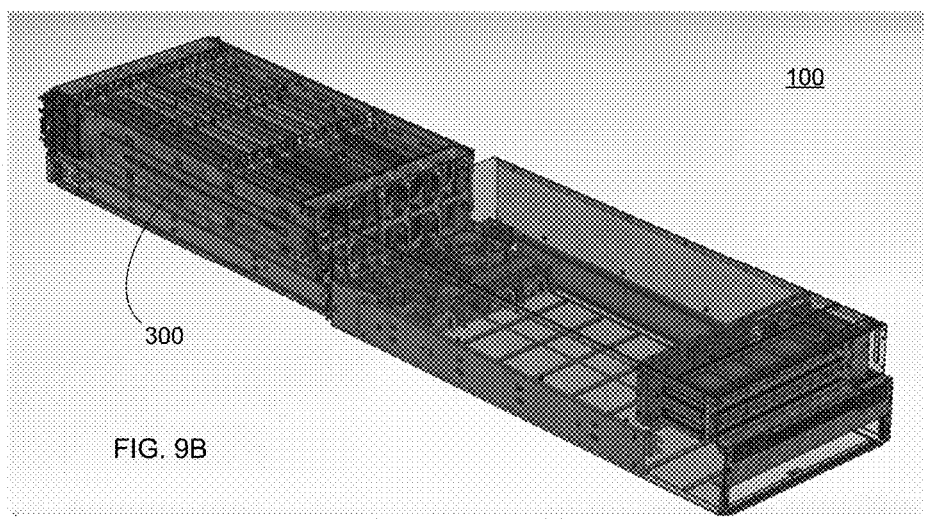

Referring also to FIGS. 9A-9B, spring-pulley system 300 may be incorporated into the chassis of rack-mountable, hyper-converged computing device 100. As discussed above, when rack-mountable, hyper-converged computing device 100 is closed (as shown in FIG. 9A), slidable portion 104 of rack-mountable, hyper-converged computing device 100 may be slid into fixed portion 102. Conversely, when rack-mountable, hyper-converged computing device 100 is opened (as shown in FIG. 9B), slidable portion 104 of rack-mountable, hyper-converged computing device 100 may be slid out of fixed portion 102.

Figure 10:
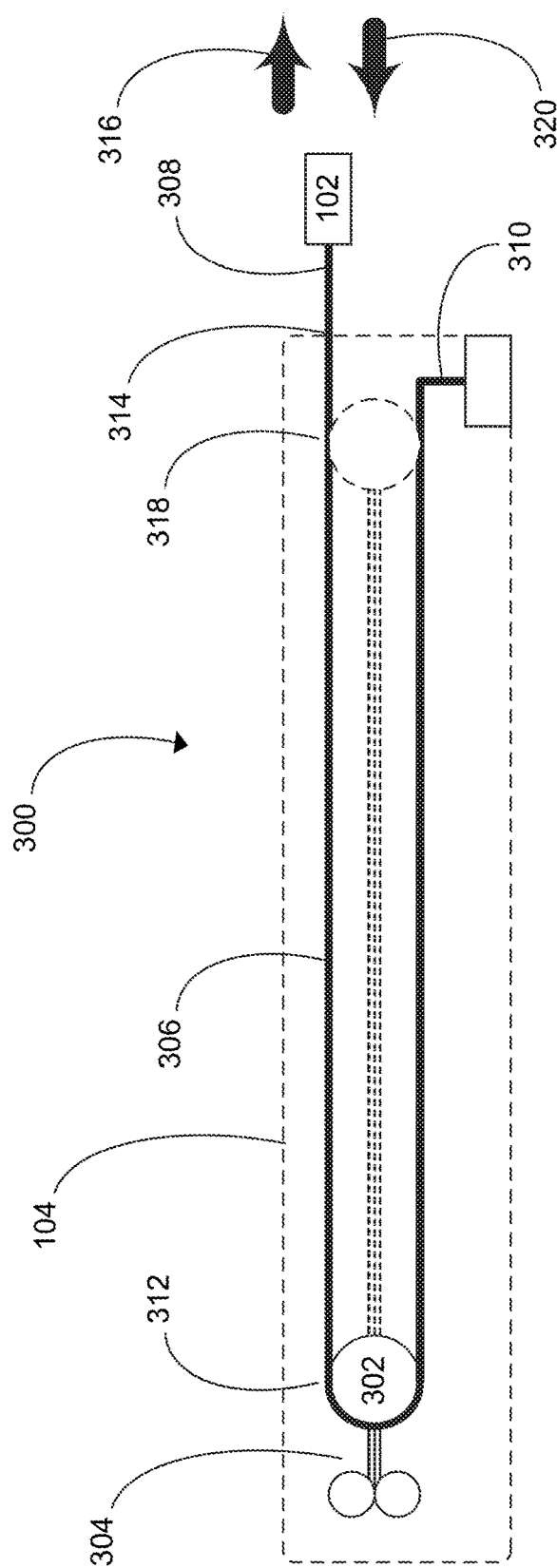
FIGS. 10-12 are diagrammatic views of a spring-pulley system for use with the rack-mountable, hyper-converged computing device of FIGS. 9A-9B according to an aspect of this disclosure.

Referring also to FIG. 10, there is shown a simplified view of spring-pulley system 300. According to this particular embodiment, spring-pulley system 300 may be incorporated into slidable portion 104 of rack-mountable, hyper-converged computing device 100. Accordingly, when slidable portion 104 is moved from the closed position shown in FIG. 9A to the open position shown in FIG. 9B, spring-pulley system 300 may also be moved.

Spring-pulley system 300 may include pulley assembly 302 that is biased toward the left (in this view) via spring assembly 304. Spring-pulley system 300 may include cable assembly 306 that may be physically and electrically coupled on first end 308 to fixed portion 102 of rack-mountable, hyper-converged computing device 100. Further, cable assembly 306 may include second end 310 that may be physically and electrically coupled to slidable portion 104 of rack-mountable, hyper-converged computing device 100.

In this particular embodiment, cable assembly 306 may be a portion of internal cable bundle 302. As discussed above, external cable termination module 162 may include one or more output connectors (e.g., output connectors 258, 260, 262, 264) configured to provide the electrical power to rack-mountable, hyper-converged computing device 100. Accordingly, each of output connectors 258, 260, 262, 264 may include at least a line voltage conductor and a neutral conductor, for a total of eight conductors. Therefore, internal cable bundle 302 (which may include at least eight conductors) may be split into two of cable assemblies 306 (each of which includes at least four conductors).

Figure 11:
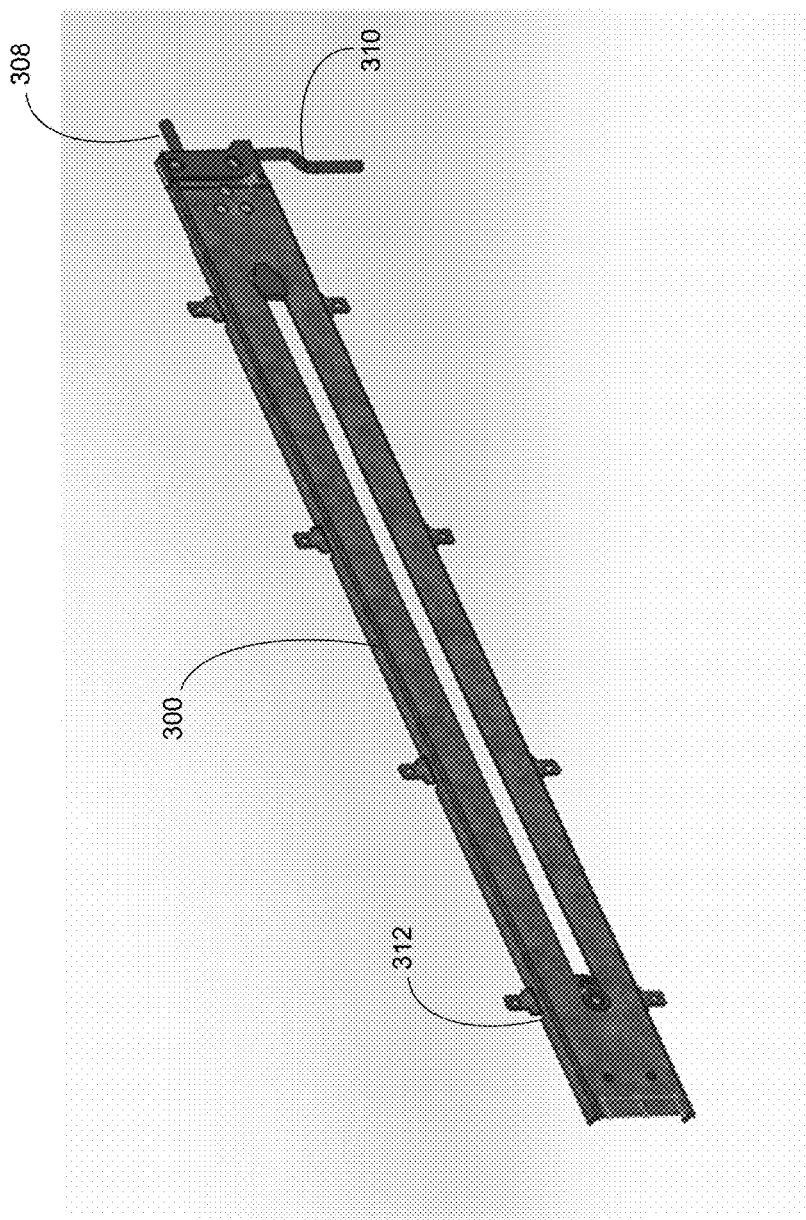
Figure 12:
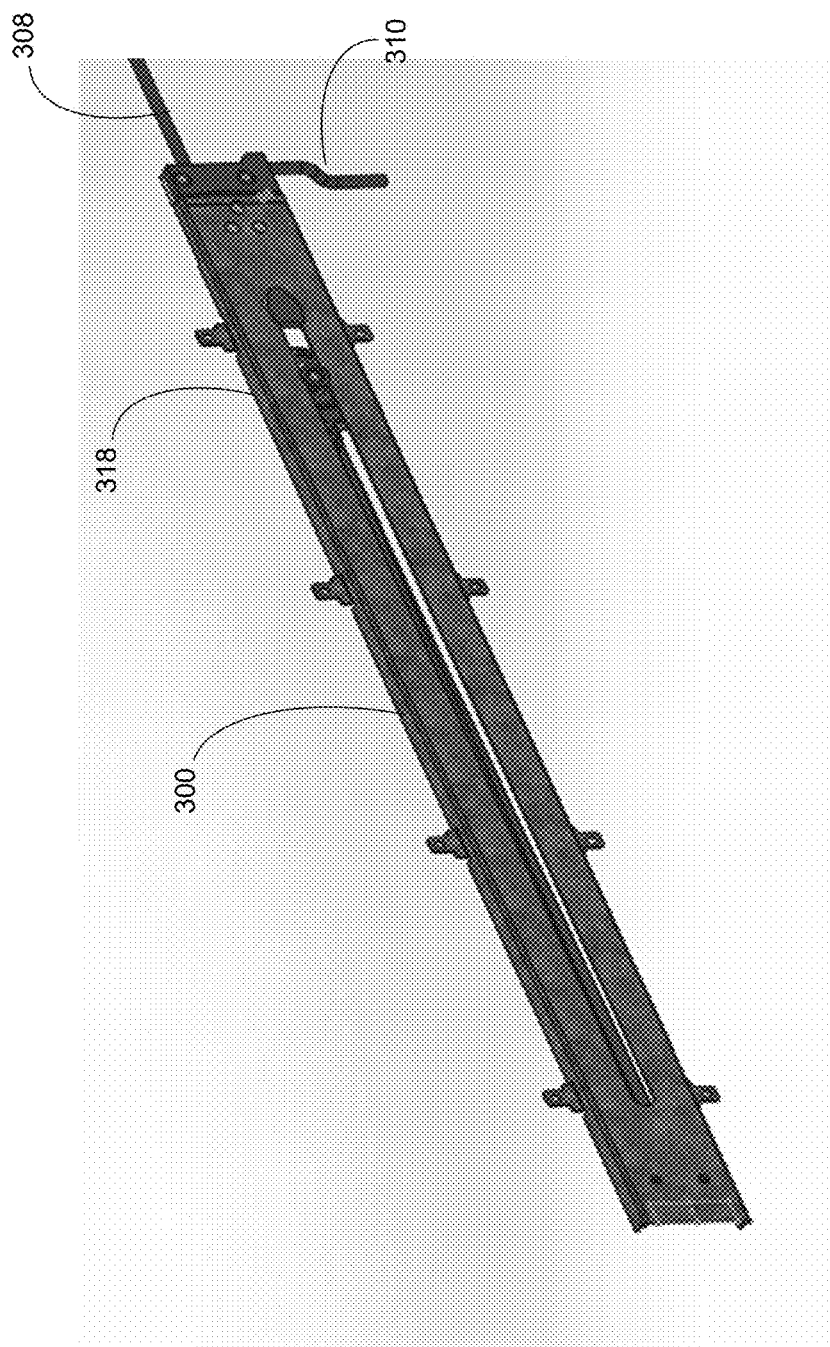

Continuing with the above-stated example and referring also to FIG. 11-12, when slidable portion 104 is in the closed position (as shown in FIG. 9A and FIG. 11), pulley assembly 302 may be in position 312. And when slidable portion 104 is moved from the closed position (shown in FIG. 9A and FIG. 11) to the open position (as shown in FIG. 9B and FIG. 12), fixed portion 102 and slidable portion 104 will be drawn apart, resulting in cable assembly 306 being drawn out of end 314 of spring-pulley system 300 (in the direction of arrow 316), resulting in pulley assembly 302 being displaced from position 312 to position 318.

As discussed above, pulley assembly 302 may be biased toward the left (in this view) via spring assembly 304. Accordingly, when pulley assembly 302 is drawn into position 318 due to the opening of rack-mountable, hyper-converged computing device 100, spring assembly 304 may continue to try to return pulley assembly 302 to position 312. Accordingly, when slidable portion 104 is moved from the opened position (as shown in FIG. 9B and FIG. 12) to the closed position (as shown in FIG. 9A and FIG. 11), fixed portion 102 and slidable portion 104 will be drawn together, resulting in cable assembly 306 being drawn back into end 314 of spring-pulley system 300 (in the direction of arrow 320) due to the biasing of spring assembly 304 displacing pulley assembly 302 from position 318 back into position 312.

Referring also to FIG. 13, there is shown a detail view of spring assembly 304. Spring assembly 304 may include a plurality of constant force springs (e.g., constant force springs 350, 352), wherein these constant force springs (e.g., constant force springs 350, 352) may each include one or more coils (e.g., coils 354, 356). These coils (e.g., coil 354 from constant force spring 350 and coil 356 from constant force spring 352) may be attached to bracket assembly 358 of pulley assembly 302.

During use, the displacing of pulley assembly 302 from position 312 to position 318 (due to the opening of rack-mountable, hyper-converged computing device 100) may result in the uncoiling of coils 354, 356 of constant force springs 350, 352, wherein returning pulley assembly 302 from position 318 back to position 312 (due to the closing of rack-mountable, hyper-converged computing device 100) may result in the recoiling of coils 354, 356 of constant force springs 350, 352.

While spring assembly 304 is shown to include two constant force springs (e.g., constant force springs 350, 352), this is for illustrative purposes only and is not intended to be a limitation of this disclosure, as other configurations are possible and are considered to be within the scope of this disclosure. For example, the number of constant force springs may be increased or decreased depending upon design criteria and the amount of biasing needed.

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A spring-pulley system configured for use within an IT component, the spring-pulley system comprising:
    a cable assembly configured to electrically couple a fixed portion of the IT component to a slidable portion of the IT component, wherein the cable assembly is configured to be drawn out of a first end of the spring-pulley system in a direction opposite of the direction of sliding of the slidable portion of the IT component while sliding the slidable portion of the IT component out from a front side of the IT component;
    a pulley assembly configured to engage the cable assembly; and
    a spring assembly configured to bias the pulley assembly toward a first position to absorb any slack in the cable assembly;
    wherein the spring-pulley system is incorporated into a side of the slidable portion of the IT component.

2. The spring-pulley system of claim 1 wherein a first end of the cable assembly is coupled to the fixed portion of the IT component.

3. The spring-pulley system of claim 1 wherein a second end of the cable assembly is coupled to the slidable portion of the IT component.

4. The spring-pulley system of claim 1 wherein the spring assembly includes at least one constant force spring.

5. The spring-pulley system of claim 4 wherein the at least one constant force spring includes at least one coil configured to be coupled to the pulley assembly.

6. The spring-pulley system of claim 1 wherein the cable assembly is a portion of an internal cable bundle.

7. The spring-pulley system of claim 1 wherein the cable assembly is configured to provide electrical power from the fixed portion of the IT component to the slidable portion of the IT component.

8. The spring-pulley system of claim 1 wherein the spring-pulley system is coupled to the slidable portion of the IT component.

9. The spring-pulley system of claim 1 wherein the cable assembly is configured to electrically couple at least a portion of a cabling module to at least a portion of an external cable termination module.

10. The spring-pulley system of claim 9 wherein the cabling module is included within the slidable portion of the IT component.

11. The spring-pulley system of claim 9 wherein the external cable termination module is included within the fixed portion of the IT component.

12. A spring-pulley system configured for use within an IT component, the spring-pulley system comprising:
    a cable assembly configured to electrically couple a fixed portion of the IT component to a slidable portion of the IT component, wherein a first end of the cable assembly is coupled to the fixed portion of the IT component and a second end of the cable assembly is coupled to the slidable portion of the IT component, wherein the cable assembly is configured to be drawn out of a first end of the spring-pulley system in a direction opposite of the direction of sliding of the slidable portion of the IT component while sliding the slidable portion of the IT component out from a front side of the IT component;
    a pulley assembly configured to engage the cable assembly; and
    a spring assembly configured to bias the pulley assembly toward a first position to absorb any slack in the cable assembly;
    wherein the spring-pulley system is incorporated into a side of the slidable portion of the IT component.

13. The spring-pulley system of claim 12 wherein the spring assembly includes at least one constant force spring.

14. The spring-pulley system of claim 13 wherein the at least one constant force spring includes at least one coil configured to be coupled to the pulley assembly.

15. The spring-pulley system of claim 12 wherein the spring-pulley system is coupled to the slidable portion of the IT component.

16. The spring-pulley system of claim 12 wherein the cable assembly is configured to electrically couple at least a portion of a cabling module to at least a portion of an external cable termination module.

17. The spring-pulley system of claim 16 wherein the cabling module is included within the slidable portion of the IT component.

18. The spring-pulley system of claim 16 wherein the external cable termination module is included within the fixed portion of the IT component.

19. A spring-pulley system configured for use within an IT component, the spring-pulley system comprising:
    a cable assembly configured to electrically couple a fixed portion of the IT component to a slidable portion of the IT component, wherein the cable assembly is a portion of an internal cable bundle and is configured to provide electrical power from the fixed portion of the IT component to the slidable portion of the IT component, wherein the cable assembly is configured to be drawn out of a first end of the spring-pulley system in a direction opposite of the direction of sliding of the slidable portion of the IT component while sliding the slidable portion of the IT component out from a front side of the IT component;
    a pulley assembly configured to engage the cable assembly; and
    a spring assembly configured to bias the pulley assembly toward a first position to absorb any slack in the cable assembly;
    wherein the spring-pulley system is incorporated into a side of the slidable portion of the IT component.

20. The spring-pulley system of claim 19 wherein:
    a first end of the cable assembly is coupled to the fixed portion of the IT component; and
    a second end of the cable assembly is coupled to the slidable portion of the IT component.

* * * * *